United States Patent [19]

Schaltenbrand et al.

[11] Patent Number: 4,943,890

[45] Date of Patent: Jul. 24, 1990

[54] SOLID STATE MOTOR STARTER

[75] Inventors: Robert W. Schaltenbrand; Brian Seman, both of Allison Park; Donald Shepherd, Saxonburg, all of Pa.

[73] Assignee: Benshaw, Inc., Glenshaw, Pa.

[21] Appl. No.: 382,727

[22] Filed: Jul. 19, 1989

[51] Int. Cl.[5] .................... H05K 7/20

[52] U.S. Cl. .................... 361/388; 363/141; 357/81

[58] Field of Search .................... 307/147; 310/64, 68 D; 174/16.3; 318/370–376; 388/860, 937; 357/79, 81; 165/80.3, 185; 363/141, 144; 361/383, 386–388, 56, 57, 100, 101, 106, 118

[56] References Cited

U.S. PATENT DOCUMENTS

| | | | |
|---|---|---|---|
| 3,896,480 | 7/1975 | Harnden, Jr. | 361/91 |
| 4,042,860 | 8/1977 | Woods et al. | 361/25 |
| 4,128,870 | 12/1978 | Knobloch et al. | 363/141 |
| 4,137,490 | 1/1979 | Brozoski | 388/830 |
| 4,205,434 | 6/1980 | Brozoski | 388/860 |
| 4,224,663 | 9/1980 | Maiese | 361/388 |
| 4,243,894 | 1/1981 | Kuntner | 361/388 |
| 4,672,248 | 6/1987 | Heyne et al. | 310/68 |
| 4,683,515 | 7/1987 | Beihoff | 361/106 |
| 4,712,030 | 12/1987 | Lakin et al. | 310/89 |
| 4,809,153 | 2/1989 | Bremer et al. | 363/141 |

*Primary Examiner*—Gerald P. Tolin

*Attorney, Agent, or Firm*—Buchanan Ingersoll

[57] ABSTRACT

A solid state motor starter assembly having controlled semiconductors mounted between heat sink members. Electrical power to the assembly can be connected an disconnected by an electrically operated solenoid that actuates a movable contact into engagement with a stationary contact mounted on the incoming heat sink. To reduce the heat generated in the semiconductor device during steady state full voltage operation, a shunting current path is established between the adjacent heat sinks by an electrically operated solenoid which moves a movable contact bar to engage stationary contact surfaces mounted directly on the heat sinks. Electrically joining the incoming line heat sink to the outgoing heat sink provides a low resistance parallel current path around the semiconductor thereby reducing the heat generated in the assembly during full voltage operation. The above contacts and solenoids can be directly mounted to a heat sink assembly thereby providing the benefits of unitized construction.

42 Claims, 4 Drawing Sheets

SOLID STATE MOTOR STARTER

FIELD OF THE INVENTION

The field of motor starters comprises a group of switching elements which may be used to control electrical power to a load. As the name implies, motor starters are commonly used to supply electrical power to motors in industrial control environments. Motor starters are also used to control elements other than motors, such as resistance heaters, lighting, and battery chargers. Prior art motor starters included mechanical devices which controlled the introduction of series resistance with AC motors. By varying the resistance between the line and the load, a controlled application of power could be achieved to an AC motor. Present solid state devices can replace such resistance type motor starters by using control gated semiconductor devices such as thyristors or SCR's. Such semiconductor devices are used in series between the line and the load, or motor. Through the use of known gating circuits, such semiconductor devices can be used to control the power applied to a load, such as an AC motor circuit. Use of solid state devices has permitted present solid state motor starters to function without the need for external resistors. The motor starter can now be housed in a single enclosure or structure which in many applications it is desirable or necessary to have sealed from the working environment. Unfortunately one of the characteristics of such semiconductor devices is their generation of heat. Such heat can be carried away from the semiconductor devices through the use of heat sinks. The heat must then be conducted away from the heat sink and ultimately outside of the control enclosure. In environments where it is required to maintain a sealed or ventilation restricted enclosure, the physical size of the enclosure grows rapidly with the power rating of the semiconductor device. One solution to reduce the heat generated in the semiconductor devices during normal operation of electrical equipment has been to wire and mount a separate bypass contactor in parallel with the semiconductor devices. Such bypass contactor would normally be a three phase magnetically operated contactor wired in parallel to the semiconductor device. When the semiconductor or SCR was fully gated on and the applied AC voltage to the motor is at a maximum, the bypass contactor would be actuated, thereby providing a path around the semiconductor device for carrying the load current. Mechanical contactors generating less heat than the semiconductor device can be used. The problems inherent with such separate bypass contactor in parallel to the semiconductor device have been that the contactor device itself requires a significant amount of space in which to be mounted and the electrical wiring required to provide such bypass circuit occupies additional enclosure space. In the past use of a separate stand alone bypass contactor and its associated wiring to form a parallel path often resulted in only a limited reduction in the size of the enclosure required for a reduced voltage AC motor starter. In addition to the bypass contactor, many motor starter applications also require an in-line contactor. This device acts as an electrically operable mechanical disconnect of the line from the load. Much like the bypass contactor, this separate in-line contactor required additional wiring from the incoming lugs and terminals to the contactor and then from the in-line contactor to the semiconductor control device. The interconnection wiring in the case of motor starting is significant because in normal industrial motor control applications, the wiring size required to handle full motor current conditions is quite large. Such wiring is not only costly but difficult to install as its large diameter requires that any bend or change in direction maintain a minimum bending radius so as not to damage the conductor. Therefore, any reduction in interconnection wiring can result in a significant space saving in the respective motor control enclosures.

BRIEF DESCRIPTION OF THE INVENTION

It is an object of the present invention to reduce the heat generated in the control enclosure without the need for separate stand alone contactor devices and their associate interconnected wiring. Another object of the invention is to provide a motor starter control that can be mounted in a motor enclosure significantly smaller than the prior art devices which required considerable interconnection wiring.

The present invention provides for mounting the semiconductor devices between heat sinks which conduct the heat away from the semiconductor device and provide a current path to and from the semiconductor device. In addition the heat sink provides a means for mounting a stationary contact which is electrically and mechanically engageable with a movable contact to complete either an incoming current path or a bypass or shunting current path. In the case of the bypass current path, the heat sinks may have a stationary contact on both the incoming and outgoing heat sinks such as to provide a shunting current path between adjacent heat sinks and around the semiconductor. Such stationary contacts are engaged by a movable contact bar. This configuration removes the necessity for any interconnection wiring to a separate bypass contactor and the need for a separate stand alone bypass contactor device. A stationary contact mounted on the incoming heat sink similarly provides for the incoming line contactor function without the necessity of wiring to a separate stand alone device.

DETAILED DESCRIPTION OF EMBODIMENTS

Figure 1:
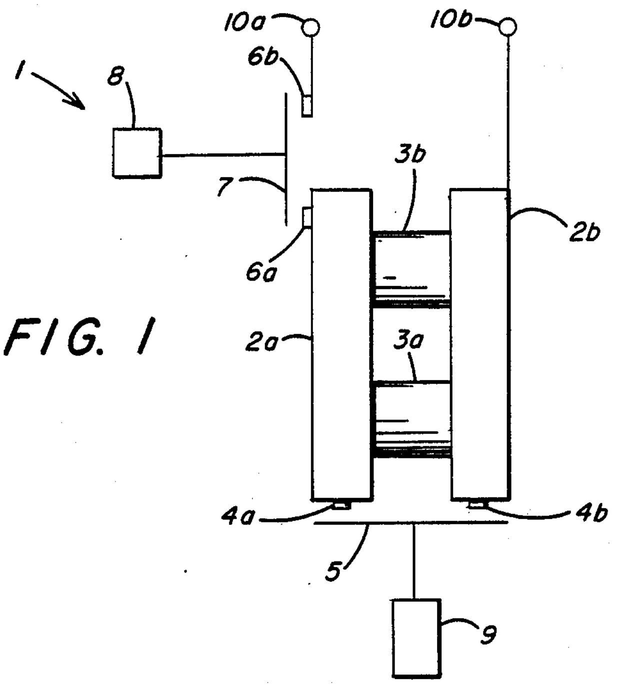
FIG. 1 is a diagramatic representation of a solid state motor starter assembly for controlling a single line to load, such as used for one phase conduction of a three phase motor circuit, having both incoming and shunting contacts mounted on the heat sinks.

Referring to FIG. 1, there is shown a single assembly that could be used for one line control in a three phase AC motor reduced voltage starting system. This contactor assembly 1 includes two heat sinks *2a, 2b* arranged in generally parallel relationship, having two semiconductor devices 3*a*, 3*b* physically and electrically joined to the heat sinks. The heat sinks 2*a*, 2*b* generally can be of the extruded aluminum type commonly used in semiconductor power assemblies and bus work. The semiconductors 3*a*, 3*b* could be silicon thyristors which through gating circuits (not shown) can be controlled in their firing phase relationship to control the output voltage and current. Power is supplied to the assembly by incoming line connector or lug 10*a*. An electrically operated incoming solenoid 8 connects the line voltage received at lug 10*a* to the line heat sink 2*a* by means of a movable line contact 7 which connects respectively the stationary line contacts 6*a* to 6*b*. Contact 6*a* is mounted directly upon the incoming line heat sink 2*a*, thereby eliminating any wiring or connectors between the contact 6*a* and the heat sink 2*a*. The solenoid 8 is a electrically operated device which keeps movable contact 7 in a normally open position and when actuated, causes the movable contact 7 to be electrically and physically connected to contacts 6*a* to 6*b*. In one preferred embodiment of the device shown in FIG. 1, semiconductors 3*a* and 3*b* would be mounted in opposing directions so as to control alternating current in both directions between incoming heat sink 2*a* and load heat sink 2*b*. Currents flowing in load heat sink 2*b* are connected to the load via the load connector or lug 10*b*. Connector 10*b* can be mounted directly on heat sink 2*b*. While the gating of semiconductors 3*a* and 3*b* provide variable control of the currents between the heat sink 2*a* and 2*b* to the load, shunting solenoid 9 controls a movable shunting contact bar 5 which, when activated, engages stationary contacts 4*a* and 4*b*, thereby providing a direct shunt or current bypass between heat sinks 2*a* and 2*b*. Contacts 4*a*, 4*b* are stationary and directly mounted to respective heat sinks 2*a*, 2*b*. When solenoid 9 is activated such as to connect stationary shunting bar 5 with contacts 4*a* and 4*b*, the load current passes from line heat sink 2*a* to load heat sink 2*b* via contact 4*a*, movable contact bar 5, and stationary contact 4*b*.

One way in which the device of FIG. 1 could be operated would be as a single element operating a single phase line in conjunction with three identical units which would act identically to that shown in FIG. 1 to result in a three phase motor starter. In such embodiment both solenoids 8 and 9 would be in their normally open unenergized position. When the motor was desired to operate, electric signals would activate solenoid 8 on the incoming line side of assembly 1, causing movable contactor bar 7 to engage stationary contact 6*a* and 6*b*, thereby placing incoming heat sink 2*a* in electrical contact with incoming line lug 10*a*. Semiconductors 3*a* and 3*b* would then be gate controlled to gradually increase the effective voltage to the motor via heat sink 2*b* and load lug/terminal 10*b*. During this voltage increasing period, the heat generated in the semiconductor devices 3*a* and 3*b* would be conducted away from such devices by heat sinks 2*a* and 2*b*. When the motor reached its desired operating criteria, such as full line voltage, then solenoid 9 would be energized forcing movable contact bar 5 against stationary contacts 4*a* and 4*b*. This shunting path between adjacent heat sinks created by stationary contact 4*a*, bar 5, and stationary contact 4*b* would then carry the load current between the adjacent heat sinks 2*a* and 2*b*. Since full load current would no longer be going through the semiconductor devices 3*a* and 3*b*, the heat generated in such semiconductor devices would be minimal. Due to the very slight resistive nature of the metallic conducting surfaces of contacts 4*a*, 4*b*, 5 the sub-assembly 1 would generate very little of the undesirable heat that is normally associated with solid state control devices.

If at any time during the normal operation it is desired to operate at less than the line voltage, the solenoid 9 can be deenergized and the shunting bar 5 disengaged from respective contacts 4*a* and 4*b*, thereby returning the load current path between heat sink 2*a* and 2*b* through respective semiconductor devices 3*a* and 3*b*.

Figure 2:
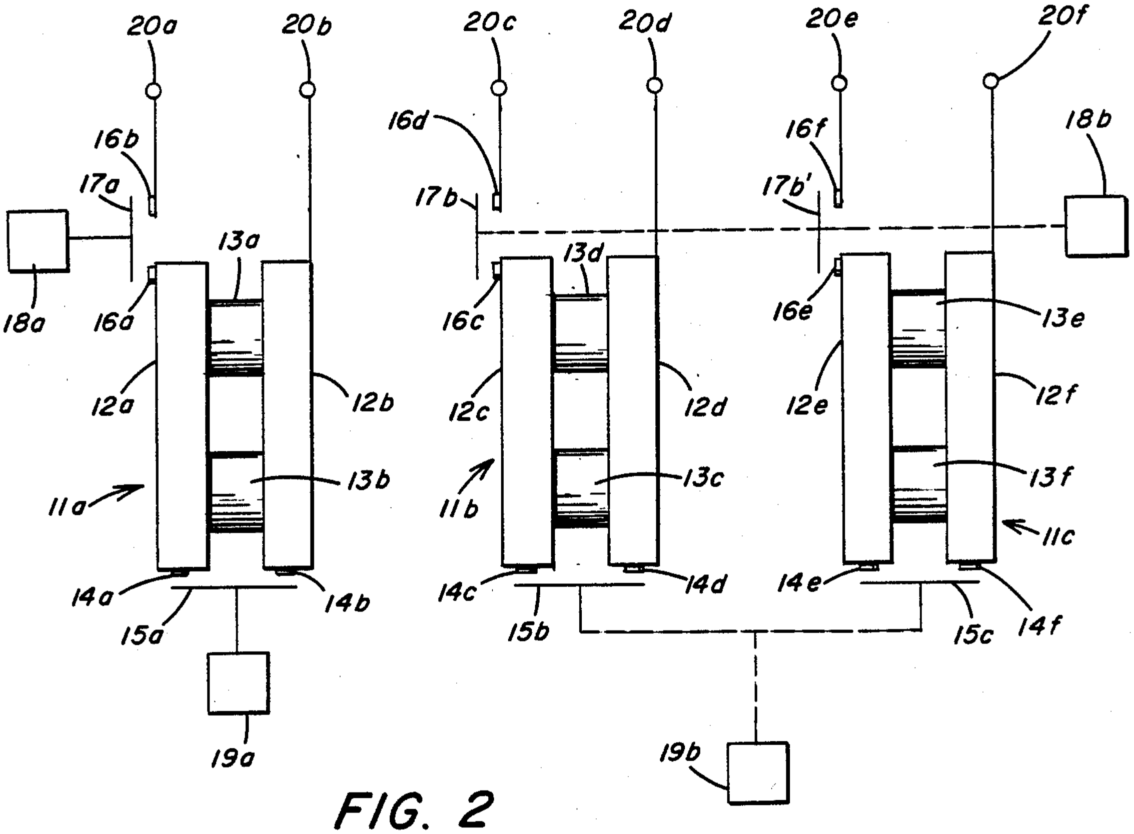
FIG. 2 is a diagramatic representation showing a number of embodiments of the invention in a three phase motor starter, having both incoming and shunting contacts mounted on their respective heat sinks.

Referring to FIG. 2, there is shown three solid state contactor assemblies 11*a*, 11*b* and 11*c*, each of which could be considered as operating a single phase in a three phase AC motor system. Incoming lugs 20*a*, 20*c*, and 20*e* can be connected to respective lines in a three phase power system. A three phase load, such as a three phase motor, could be connected between outgoing connectors 20*b*, 20*d*, 20*f*. The assembly shown at 11*a* operates similar to that shown in FIG. 1. The current path during conductance is from incoming line connector 20*a* to stationary contact 16*b* through movable contactor bar 17*a* which is operated by line solenoid 18*a* to engage both contact 16*a* and 16*b*. A stationary contact 16*a* is mounted on line heat sink 12*a*. Semiconductors, such as thyristors 13*a* and 13*b*, provide gate controlled flow between heat sinks 12*a* and 12*b*. Current is conducted from respective thyristors 13*a* and 13*b* via load heat sink 12*b* to lug 20*b* which can be connected to one phase of the load. When full voltage operation and reduced heating is desired, solenoid 19*a* is energized causing shorting bar 15*a* to contact stationary contacts 14*a* and 14*b* mounted on the respective heat sinks 12*a* and 12*b*. This assembly 12*a* uses a separate solenoid for each set of incoming line contacts 16*a* and 16*b*. Also a single solenoid actuates a single shorting bar 15*a* which in turn contacts stationary contacts 14*a* and 14*b*.

Three devices similar to 11*a* could be used to create a three phase motor starter. In such a motor starter each phase would have a separate solenoid operating respective incoming contacts and shunting contacts, so that a total of six solenoids would be used. As shown in assemblies 11*b* and 11*c*, multiple assemblies may be ganged together and have their respective incoming movable contacts 17*b* and 17*b*' actuated from a single electric solenoid 18*b*. Similarly the shorting contactor bars 15*b* and 15*c* can be operated from a single electrically operated solenoid 19*b*. While the solenoids 18*b* and 19*b*, as shown in FIG. 2, operate only two assemblies 11*b* and 11*c*, such solenoids could in various embodiments of the invention operate a plurality of semiconductor subassemblies. One such embodiment would include a three phase network similar to that shown in FIG. 2 in which solenoid 18*b* also is mechanically connected to shorting bar 17*a* on the incoming line contact of assembly 11*a*. Similarly the movable shunting bar 15*a* on assembly 11*a* could be mechanically joined to operate from solenoid 19*b*. In such an embodiment a three phase solid state motor starter having both incoming line contactors and bypass or shunting contactors on the heat sinks would require only two solenoids, such as 18*b* and 19*b*. In such embodiment there is no need for solenoids 18*a* and 19*a*.

Current paths in sub-assembly 11*b* during operation would include incoming line voltage at lug 20*c* being conducted to stationary contacts 16*d* and via movable contact 17*b* to stationary contact 16*c* which is rigidly attached directly to heat sink 12*c*. During full voltage operation a current path could exist via semiconductors

13*d* and 13*c* which may be respectively gated to their full-on conducting state. When desired, by actuation of solenoid 19*b*, a parallel shunting current path would exist through stationary contact 14*c* which is rigidly affixed to line heat sink 12*c* and contact 14*d* which is rigidly affixed to load heat sink 12*d*, both being joined by movable shunting contact bar 15*b*.

A similar current path exists through sub-assembly 11*c* in which incoming line voltage at lug 20*e* is conducted via contact 16*f*, movable contactor bar 17*b*', stationary contact 16*e* which is affixed to heat sink 12*e*. When desired, solenoid 19*b* is actuated, shunting bar 15*c* engages stationary contacts 14*e* and 14*f* which are respectively mounted on heat sinks 12*e* and 12*f* causing a shunting current path between the heat sinks which is parallel to the control gated current flow via semiconductors 13*e* and 13*f*. Current flows from the load heat sink 12*f* through the load via connector 20*f*.

As can be understood, when a plurality of incoming movable contacts are mechanically actuated by a single solenoid, all such movable contacts will be urged into engagement or disengagement with their respective stationary contacts. Closure of shunting contacts 14 and 15 can be coordinated with the thyristor gate circuits so as to close when the voltage between adjacent heat sinks is minimum (full-on state) so as to minimize the voltage rating on the shunting contacts. Similarly the opening of shunting contacts 14, 15 can be coordinated with the gate circuit to occur only in the full-on state to minimize the voltage and arcing during current interruption at contacts 14,15.

The incoming solenoids such as 18*a*, 18*b* can be coordinated with the thyristor gating circuit to first phase off the thyristor, reducing the load current to a minimum or trickle value before opening contacts 16,17. This reduction in wear contact that can be achieved by such coordination is especially important where contacts 16*a,c,e*, 14*a,b,c,d,e,f* are contact surfaces of the heat sink or coated surfaces on the aluminum heat sink.

Figure 3:
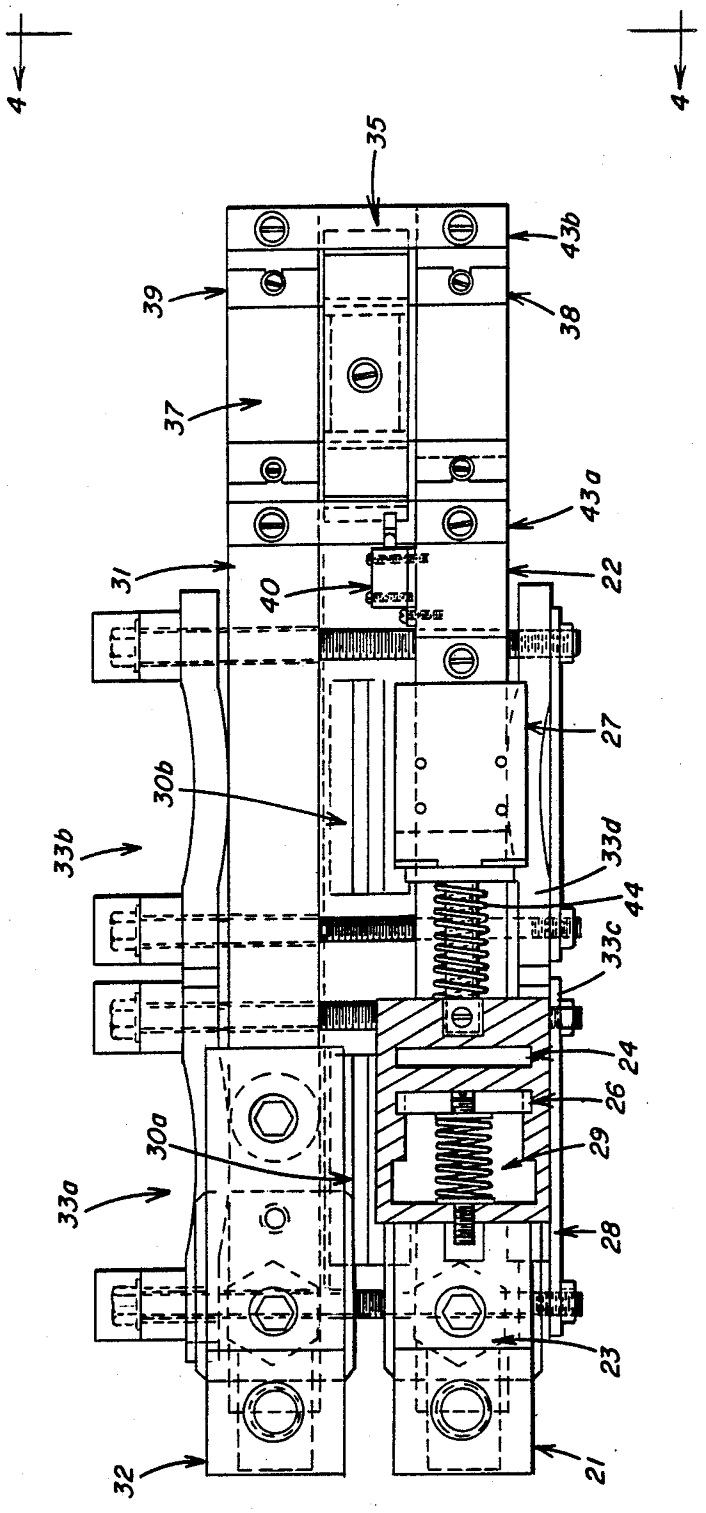
FIG. 3 is a top view shown in partial section of a solid state motor starter assembly similar to that shown in diagram FIG. 1 which could be used for a single line in a three phase AC motor starter.
Figure 4:
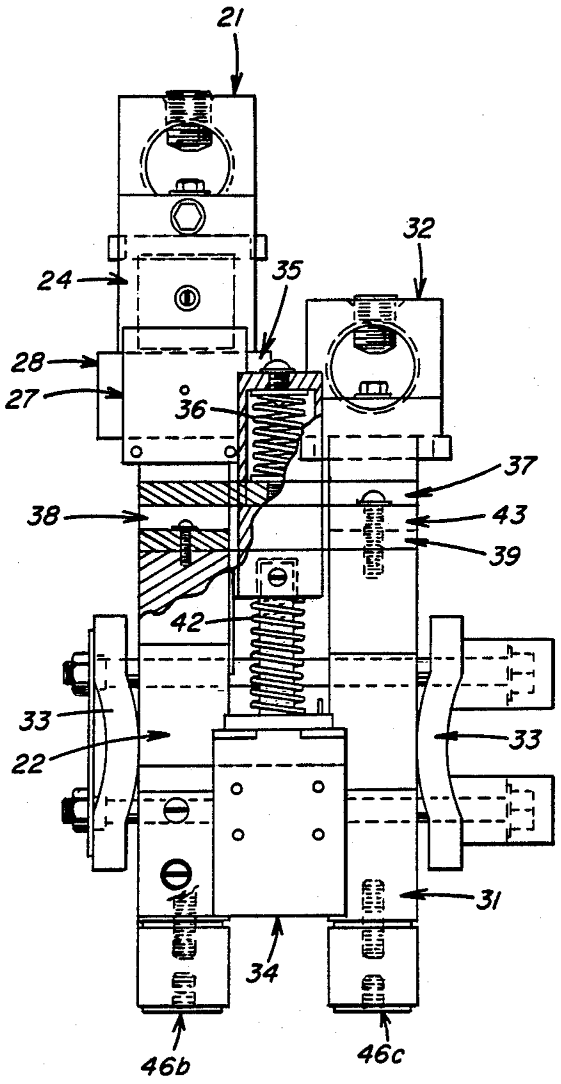
FIG. 4 is an end view shown in partial section of the device of FIG. 3 with details of the shunting contacts.
Figure 5:
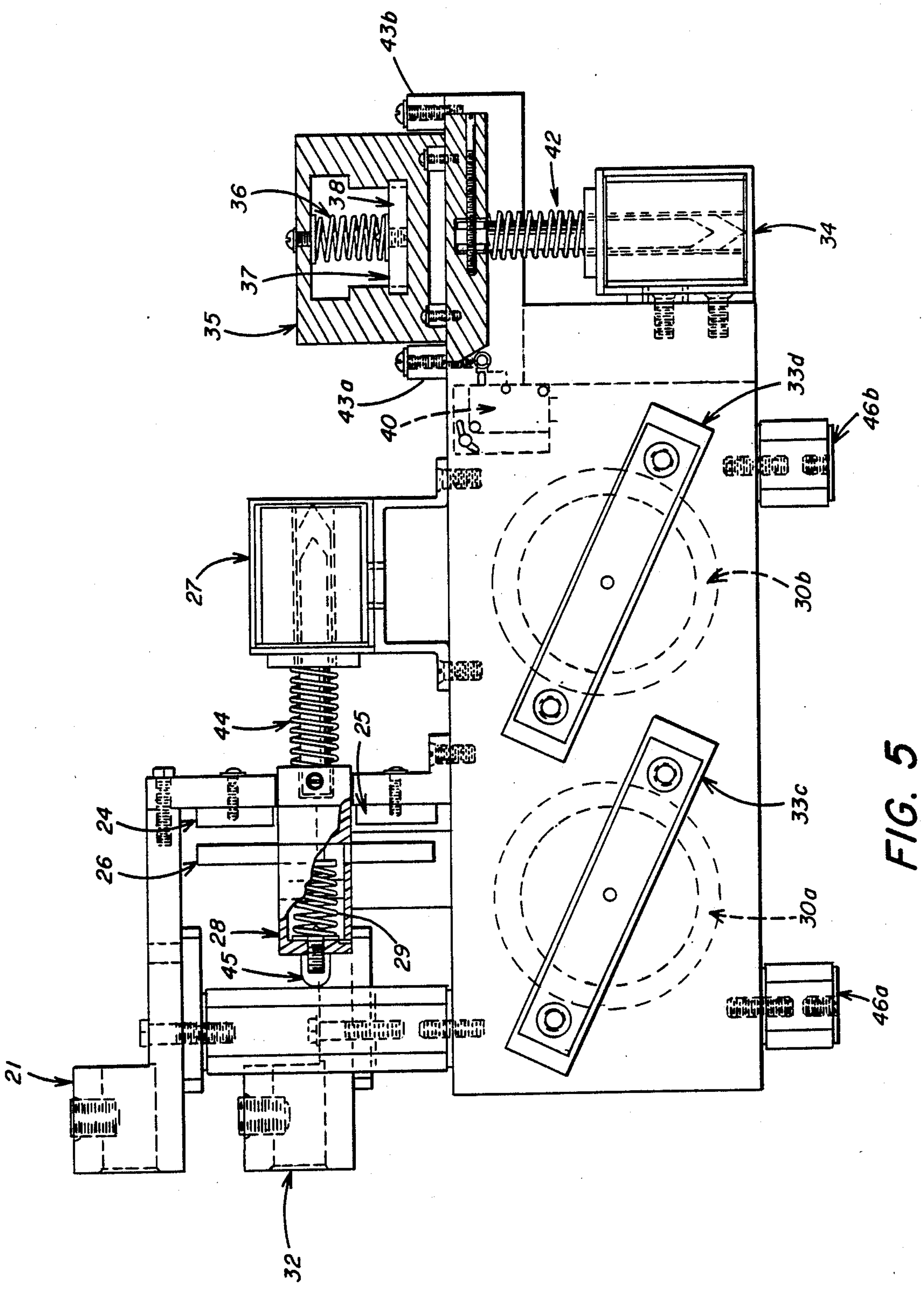
FIG. 5 is side view along the incoming heat sink of the device of FIG. 3 shown in partial section.

Referring now to FIGS. 3, 4 and 5 shows a solid state sub-assembly similar to the diagramatic representation in FIG. 1 but in more detail. This embodiment has an incoming power lug 21 and an outgoing lug 32. Incoming heat sink 22 is generally parallel spaced from outgoing heat sink 31. Preferably these heat sinks are made of aluminum. Semiconductor devices 30*a* and 30*b* are clamped within the space between heat sinks 22 and 31. Spring clamps 30*a*, 30*b*, 30*c* and 30*d* are compressed by through bolts to forcibly clamp the semiconductor devices between the heat sinks. In the preferred embodiment semiconductor devices 30*a* and 30*b* would be thyristors or silicon controlled rectifiers having well known gating circuits which control the "on time" to coordinate with the desired load characteristics. A source of incoming AC voltage, such as a cable, is clamped in incoming power lug 21 which provides electrical power to the incoming stationary contact 24. A dual movable contact or bar 26 can be seen in FIG. 5 to span both stationary contacts 24 and 25. Stationary contact 25 is rigidly mounted to incoming heat sink 22. Such rigid mounting comprises an L-shaped bracket extending generally perpendicular to the upper surface of heat sink 22. The contactor surface on contact 25 being a renewable wear surface threadably attached perpendicular to the longitudinal direction of the heat sink 22. When the incoming solenoid 27 is activated, moving the armature of the solenoid 27 to the right as viewed in FIG. 5, the movable contact 26 forcibly and electrically connects the stationary contacts 24, 25 with movable contact 26. Electrical power is then available from lug 21 to the incoming heat sink 22.

When solenoid 27 is energized it pulls the armature to the right which in turn moves the contact frame 28 towards the solenoid 27. The contact frame 28, as viewed in FIG. 3, is provisioned for mounting spring 28 which bears against the movable contact 26. Contact spring 9 maintains proper pressure between the movable contact 26 and the stationary contacts 24 and 25 during closure. Rectangular frame 28 is preferably made of an insulating material which provides guidance to the movable contact 26 so as to properly and reliably align the movable contact bar 26 with the stationary contacts 24 and 25. Return spring 44 functions to oppose the movement of contact frame 28 into the closed position and is used when solenoid 27 is deactivated so as to open the set of contacts 24, 25 and 26.

The functional bypass circuit is established through stationary contact 38 on the incoming heat sink and stationary contact 39 on the outgoing heat sink. In this embodiment of the shunting contacts the stationary contacts 38 and 39 are merely contact wear surfaces held by threaded bolts to the heat sink. In some embodiments the contact surface of the stationary contact could be bonded to the surface of the heat sink or be the actual heat sink itself. The bypass or shunting movable contact 37 is held in a rectangular frame member 35 which functions similar to the prior described frame member 28 for the incoming line contacts. The shunting contact frame member 35, as best seen in FIG. 4, moves between the heat sinks in the space intermediate the heat sinks. Because frame 35 is made of a non-conducting material, physical contact with the heat sink inner surfaces can act as a means to guide the frame 35 between its extremes of travel which also thereby controls the alignment between the movable contact piece 37 and the stationary contacts 38 and 39. When the frame 35 moves downwardly as viewed in FIG. 4, the stationary contacts 38 and 39 are engaged by the movable contact 37 which is urged into electrical and physical contact by the force exerted by spring 37 which is caged within the frame 35. When the solenoid 34 is deenergized, return spring 34 pushes frame 35 upward causing the movable contact 37 to disengage physical and electrical contact with the stationary contacts 38 and 39.

The movable frame 35, as seen in FIG. 5, is attached to the solenoid in such a manner that at least a portion of the insulated material comprising the frame 35 extends into the gap between adjacent heat sinks 22 and 31. This lower extension provides for holding the frame member 35 in alignment above the stationary contacts 38 and 39. As seen in FIG. 4, the frame member 35 is continuously guided in its downward movement by the adjacent inner surfaces of heat sinks 22 and 31.

The complete assembly is isolated from electrical contact via mounting insulating feet 46*a*, 46*b*, 46*c* and 46*d*. Except for the gating circuits all elements of the starter are mounted on the heat sink. Electrical current from the load heat sink 31 is conducted from the assembly via load power lug 32.

To sense operation and coordinate the operation of the shunting contact, a switch element, such as limit switch 40, can be mounted to sense the position of the movable contact. One such means is shown in which limit switch 40 has a roller portion which contacts the insulated frame 35. Similar limit switches could be installed on the movable frame 28 to sense the position of the incoming line contacts.

The device of FIGS. 3, 4 and 5 could be used along with two identical assemblies to create the three phase motor starter previously described using six solenoids, three for the individual incoming line contacts and three for the individual shunting contacts on each sub-assembly.

One preferred embodiment would be to arrange three assemblies, such as have been described in all heat sinks with generally parallel relationship. In such an assembly only one of the shunting contacts would be directly driven by its related shunting solenoid 34 and mechanical means would be attached to that solenoid to drive respective movable contacts on the remaining solid state sub-assemblies. One such preferred arrangement would be to drive the middle sub-assembly shunting contacts directly and have the outer sub-assemblies connected mechanically to the single center solenoid. Similarly a single central solenoid could be used to operate the incoming line movable contact 26 and also drive a mechanical means for activating similar movable contacts on adjacent sub-assemblies. Other embodiments would include the solenoid acting through mechanical linkage to drive a plurality of movable contacts.

While two specific embodiments of mounting the stationary contact directly upon the heat sink have been shown, namely a 90° L-shaped bracket with a wear surface, 25 for the incoming contact and parallel to the heat sinks wear surface 38 bolted to the upper plane of the heat sink for the shunting contacts, other modes are contemplated within the invention. In some applications it may be desirable to use the heat sink surface directly, or bond a coating, such as silver or copper, directly on the heat sink. Renewable contact wear surfaces of other styles can also be used in the invention.

While the stationary contact shown in the figures have been mounted on the upper surface of the heat sink, it is equally feasible in applications, where desirable, to mount the stationary contacts upon the lower surface or other areas of the heat sinks. The use of the non-conducting, insulating material, frame for carrying and guiding the movable contact or shunting bar has been found to provide the additional benefit of permitting the adjacent surfaces of the heat sink to act as guide members in positioning the movable contact reliably upon the stationary contact members. Applicant's invention permits the heat sink to provide at least eight functions, namely, conduct heat away from the SCR's, provide a line current path to the SCR's, provide a load current path from the SCR's to the load, provide for physical mounting of the SCR, provide a solid current path to the bypass contactor without the necessity for wires, provide a support for the stationary contact, provide a means for guiding the movable contact to the stationary contact, and provide support for the operating solenoids.

During operation when the nominal output voltage reaches its maximum value, the bypass solenoid 34 is energized, providing a path for the load current around semiconductors 30*a* and 30*b*. Since this load current is bypassed around the semiconductors, the semiconductors 30*a* and 30*b* generate little heat and the whole unit runs at a much lower temperature. When it is desired to reduce or break the load current, the solenoid 34 is first deenergized which causes the load current to be transferred back to the semiconductors 30*a* and 30*b*. The semiconductors 30*a* and 30*b* then under gate control command the load current to go to a reduced level or to shut off. When the semiconductors 30*a* and 30*b* are gated "off", the load current is reduced to a very low leakage current level. At this time the solenoid 27 is then deenergized, causing the movable contact to interrupt the circuit and remove the semiconductors and the heat sinks from the power line.

While t e invention disclosed herein has been described as a solid state motor control, indeed such is a common description of such devices, the assemblies and invention shown herein can be used for other applications such as battery chargers, resistive heating, lighting, or other known applications.

One of the advantages of the invention is to provide for a small package with all major components mounted directly on the heat sink which produces little heating during full voltage operation, and therefore the heat sink can be designed to handle only the heat generated during the anticipated reduced voltage of the duty cycle. This results in even smaller packaging. Packaging is important, both from the aspect of permitting application of the control assembly enclosure to be mounted in the optimum location relative to the equipment, such as motors and drives, and permitting a small volume cabinet to be enclosed so as to limit interaction with the operating environment.

While the aforegoing description and drawings show certain presently preferred embodiments of the invention, it is to be understood that the invention is not limited thereto and includes the various embodiments and practices within the broader scope of the invention.

I claim:

1. A starter control assembly comprising:
- at least two electrically conducting heat sink members in spaced relation from each other;
- at least one solid state control device being physically and electrically connected intermediate said heat sink members;
- at least one of said heat sink members being a line heat sink;
- connector means for receiving a source of electrical power;
- at least one of said heat sink members being a load heat sink having means for delivering electrical power to a load;
- at least one stationary contact mounted on one of said heat sinks; and
- at least one movable contact means selectively engaging said stationary contact and establishing an electrical current path between at least one of a shunting path between said line and load heat sinks, and an incoming path between said connector means and said line heat sink.

2. The starter control assembly of claim 1 wherein said at least one stationary contact includes at least one stationary contact mounted on each of said heat sinks.

3. The starter control assembly of claim 1 wherein said at least one stationary contact includes at least one stationary contact mounted on each of said line and load heat sinks; and said movable contact means engages said stationary contacts on said line and load heat sinks to selectively establish a shunt path between said line and load heat sinks.

4. The starter assembly of claim 3 further comprising a shunt frame means for mounting said movable contact that establishes a shunt path; and said shunt frame means being non-electrically conducting.

5. The starter control assembly of claim 4 wherein said shunt frame means at least partially extends into the space between said line and load heat sinks.

6. The starter control assembly of claim 4 wherein said shunt frame means is mounted to at least partially engage a surface on said heat sinks to guide said shunt frame in movement thereby aligning said movable contact with said stationary contacts.

7. The starter control assembly of claim 5 further comprising electrical solenoid means at least partially extending into the space between said line and load heat sinks.

8. The starter control assembly of claim 7 wherein said solenoid means is mounted on at least one of said heat sinks and electrically insulated from said at least one heat sink.

9. The starter control assembly of claim 1 wherein said at least one stationary contact includes at least one stationary contact mounted on said line heat sink.

10. The starter control assembly of claim 1 wherein said at least one stationary contact includes at least one stationary line contact mounted on said line heat sink; and said movable contact means is a movable line contact that engages said stationary contact on said line heat sink to selectively establish an incoming path between said connector means and said line heat sink.

11. The starter control assembly of claim 10 further including a line frame means for mounting said movable line contact that establishes an incoming path; and said line frame means being electrically non-conducting.

12. The starter control of claim 11 wherein said connector means includes lug means for connecting an electrical conductor and an associated stationary contact rigidly and electrically connected to said lug means; and said lug means and said associated stationary contact being rigidly mounted to said line heat sink and electrically insulated from said line heat sink when said movable line contact is in a disengaged state.

13. The starter control of claim 11 wherein said movable line contact is activated by an electrical solenoid mounted on said line heat sink.

14. The starter control of claim 10 wherein said stationary line contact is mounted on said line heat sink by a bracket extending generally perpendicular from the mounting surface of said line heat sink.

15. The starter control assembly of claim 1 wherein said at least two heat sink members include six heat sinks, three being line heat sinks and three being load heat sinks being arranged in paired relation.

16. The starter control assembly of claim 15 having at least one stationary contact mounted on each heat sink; and having three movable shunting contact means for selectively engaging respective pairs of said stationary contacts to establish an electrical current shunting path between respective pairs of said line and load heat sinks.

17. The starter control assembly of claim 16 having three electric solenoids operably connected to respective said movable shunting contact means.

18. The starter control assembly of claim 17 wherein said solenoid is mounted on at least one of each pair of heat sinks.

19. The starter control assembly of claim 16 having an electric solenoid operably connected to operate at least one of said movable shunting contact means.

20. The starter control assembly of claim 19 wherein said solenoid is mounted on at least one of said heat sinks.

21. The starter control assembly of claim 15 having a stationary line contact mounted on each of said line heat sinks, and having three movable line contacts that can selectively engage said stationary line contact to establish an incoming path between said connector means and said line heat sink.

22. The starter control assembly of claim 21 wherein said connector means includes lug means for connecting an electrical conductor and an associated stationary contact rigidly and electrically connected to said lug means, and said lug means and said associated stationary contact being rigidly mounted to said line heat sink and electrically insulated from said line heat sink when said movable line contact is in a disengaged state.

23. The starter control assembly of claim 22 further including at least one electric solenoid operably connected to move at least one of said movable line contacts.

24. The starter control assembly of claim 23 wherein said solenoid is mounted on at least one of said line heat sinks.

25. The starter control assembly of claim 23 including three solenoids, each mounted on respective line heat sinks.

26. The starter control assembly of claim 23 having a single solenoid operably connected to move said three movable line contacts.

27. The starter control assembly of claim 26 wherein said solenoid is mounted on at least one of said line heat sinks.

28. The starter control assembly of claim 1 wherein said stationary contact includes an electrically conducting surface of said heat sink.

29. The starter control assembly of claim 28 wherein said surface is coated with a wear resistance material.

30. The starter control assembly of claim 1 wherein said stationary contact includes a renewable wear surface of electrically conducting material rigidly attached to said heat sinks.

31. The starter control assembly of claim 30 wherein said wear surface is a rigid member attached by a fastener to said heat sinks.

32. The starter control assembly of claim 1 wherein said stationary contact includes a rigid bracket extending generally perpendicular to the surface of the heat sinks and having a renewable wear surface of electrically conducting material attached thereto.

33. The starter control assembly of claim 10 wherein said stationary contact includes an electrically conducting surface of said heat sink.

34. The starter control assembly of claim 33 wherein said surface is coated with a wear resistance material.

35. The starter control assembly of claim 10 wherein said stationary contact includes a renewable wear surface of electrically conducting material rigidly attached to said heat sinks.

36. The starter control assembly of claim 35 wherein said wear surface is a rigid member attached by a fastener to said heat sinks.

37. The starter control assembly of claim 12 wherein said stationary line contact includes a rigid bracket extending generally perpendicular to the surface of the heat sinks and having a renewable wear surface of electrically conducting material attached thereto.

38. The starter control assembly of claim 16 wherein said stationary contact includes an electrically conducting surface of said heat sink.

39. The starter control assembly of claim 38 wherein said surface is coated with a wear resistance material.

40. The starter control assembly of claim 16 wherein said stationary contact includes a renewable wear surface of electrically conducting material rigidly attached to said heat sinks.

41. The starter control assembly of claim 40 wherein said wear surface is a rigid member attached by a fastener to said heat sinks.

42. The starter control assembly of claim 21 wherein said stationary line contacts includes a rigid bracket extending generally perpendicular to the surface of the heat sinks and having a renewable wear surface of electrically conducting material attached thereto.

* * * * *